(12) United States Patent
Takahashi et al.

(10) Patent No.: US 8,189,356 B2
(45) Date of Patent: May 29, 2012

(54) PWM INVERTER

(75) Inventors: Hajime Takahashi, Kitakyushu (JP); Mitsujiro Sawamura, Kitakyushu (JP)

(73) Assignee: Kabushiki Kaisha Yaskawa Denki, Fukuoka, Tokyo ( * ) Notice: Subject to any disclaimer, the term of this patent is extended or adjusted under 35 U.S.C. 154(b) by 828 days.

(21) Appl. No.: 12/295,926

(22) PCT Filed: Mar. 6, 2007

(86) PCT No.: PCT/JP2007/054323
§ 371 (c)(1),
(2), (4) Date: Oct. 3, 2008

(87) PCT Pub. No.: WO2007/113972
PCT Pub. Date: Oct. 11, 2007

(65) Prior Publication Data
US 2009/0161393 A1 Jun. 25, 2009

(30) Foreign Application Priority Data
Apr. 6, 2006 (JP) .................................. 2006-105628

(51) Int. Cl.
*H02M 7/537* (2006.01)
(52) U.S. Cl. .......................................... 363/131; 363/97

(58) Field of Classification Search .................. 323/283; 363/95, 97, 41, 42, 131
See application file for complete search history.

(56) References Cited

U.S. PATENT DOCUMENTS
6,700,803 B2 * 3/2004 Krein ............................... 363/41
2006/0038599 A1 * 2/2006 Avants et al. .................. 327/276

FOREIGN PATENT DOCUMENTS
| JP | 2000-102257 A | 4/2000 |
| JP | 2001-197725 A | 7/2001 |
| JP | 2006-14449 A | 1/2006 |
| WO | 2005/034327 A1 | 4/2005 |

* cited by examiner

*Primary Examiner* — Harry Behm
*Assistant Examiner* — Matthew Grubb
(74) *Attorney, Agent, or Firm* — Sughrue Mion, PLLC

(57) ABSTRACT

There is provided a PWM inverter capable of preventing a phase error from occurring in generating a PWM signal even in the case where a carrier wave frequency is not sufficiently higher than a signal wave frequency. A PWM signal generating section (2) includes a phase adjusting section (11) configured to advance a phase of the signal wave by adding, to a signal wave, a delay component of the PWM signal with respect to the signal wave, the phase delay component being involved by digital control. Furthermore, in a case where the carrier wave frequency is changed, the phase delay component with respect to the signal wave is updated in synchronism with the timing of change of the carrier wave frequency.

4 Claims, 9 Drawing Sheets

PWM INVERTER

TECHNICAL FIELD

The present invention relates to a PWM inverter which controls the AC output voltage in DC-to-AC conversion.

BACKGROUND ART

FIG. 7 shows the configuration of a PWM signal generating section of a PWM inverter in a first conventional technique.

In FIG. 7, numeral 3 denotes a comparator. Symbol a denotes a signal wave, b denotes a carrier wave, and PWM denotes a PWM signal.

As shown in FIG. 7, the PWM signal generating section of the conventional PWM inverter compares a signal wave a and a carrier wave b to determines an output state according to their amplitude magnitude relationship (see e.g., Patent document 1).

FIG. 8 shows a PWM signal waveform in the PWM signal generating section of the first conventional technique. In FIG. 8, symbol a denotes a signal wave; b, a carrier wave; t, time; T, a period of the carrier wave b; and PWM, a PWM signal.

The PWM signal waveform in the first conventional technique will be described below with reference to FIG. 8.

If, for example, the PWM signal is given a value "1" when the signal wave a is larger than the carrier wave b and is otherwise given a value "0", a PWM waveform as shown in FIG. 8 is obtained. In this case, if the amplitude of the carrier wave b is assumed to be "1," average values, over one period T of the carrier wave b, of the signal wave a and the PWM signal are approximately the same.

FIG. 9 shows the configuration of a PWM signal generating section of a PWM inverter in a second conventional technique. In FIG. 9, numeral 3 denotes a comparator for comparing a signal wave and a carrier wave and numeral 4 denotes a trigonometric function calculating section. Symbol A denotes a desired amplitude; Θ, a desired phase; a1, a signal wave; b, a carrier wave; and PWM, a PWM signal.

FIG. 10 shows a PWM signal waveform in the PWM signal generating section of the second conventional technique. In FIG. 10, symbol a and a1 denote signal waves; b, a carrier wave; t, t1, and t2, time and time points; T, a period of the carrier wave b; and PWM, a PWM signal.

The operation of the PWM signal generating section of the PWM inverter of the second conventional technique will be described below with reference to FIGS. 9 and 10.

With the progress of the digital control in PWM inverter, in the case where vector control or the like is used, a signal wave a is generated frequently (commonly) using a trigonometric function on the basis of two data, that is, an amplitude A and a phase θ. In this case, a signal wave a1 is given by Equation (1):

$$a1 = A \sin \theta \quad (1)$$

Because of the digital control, Equation (1) is executed in a certain control cycle. For example, in the case where it is executed in synchronism with a carrier wave frequency, the signal wave a1 is generated by quantization whose period is equal to the carrier wave period T. As a result, the signal wave a1 is given a waveform as shown in FIG. 10. The comparator 3 performs comparison using such a signal wave a1.

As described above, in the PWM signal generating section of the conventional PWM inverter, digital control is used in generating a signal wave a1 from two data (amplitude A and phase θ) using a trigonometric function. The signal wave a1 and a carrier wave b are compared by the comparator 3 to determine an output state according to their amplitude magnitude relationship.

Patent document 1: JP-A-2000-102257 (FIG. 3)

DISCLOSURE OF THE INVENTION

Problems to be Solved by the Invention

However, there is a problem in that the PWM signal that is generated and output by using the conventional technique is a signal that is delayed from the signal wave a and thus the amplitude A and the phase θ are not transmitted correctly. This will be checked below in a period of time $t_1$ to $t_2$ (arrow portion in FIG. 10). The phase of the signal wave a waveform advances $\omega(t_2 - t_1)$ in time period $t_1$ to $t_2$. On the other hand, the phase of the generated PWM waveform remains, for the one period T, the phase $\omega t_1$ at time $t_1$ when the one cycle starts. This is because the signal wave a1 which is generated by quantization whose period that is equal to the carrier wave period T is sampled at time $t_1$. In this case, ω is the angular frequency of the signal wave a ($\omega = \theta/t_1$). Therefore, in the period T, the phase of the signal wave a is equal to $\omega(t_2 + t_1)/2$ and hence has an error Δθ (see the following Equation (2)) from the phase of the PWM waveform:

$$\Delta\theta = \omega(t_2+t_1)/2 - \omega t_1 = \omega T/2 \quad (2)$$

As seen from Equation (2), there is a problem in that this phase error is large when the frequency of the carrier wave b is not sufficiently higher than that of the signal wave a.

The present invention has been made in view of the above problems, and an object of the present invention is to provide a PWM inverter capable of preventing a phase error from occurring in generating a PWM signal even in the case where the frequency of a carrier wave is not sufficiently higher than that of a signal wave.

Means for Solving the Problems

To solve the above problem, according to a first aspect of the present invention, there is provided a PWM inverter for controlling an AC voltage using a PWM signal. The PWM inverter includes: a DC-to-AC converting section configured to convert a DC voltage into the AC voltage; and a PWM signal generating section configured to generate the PWM signal by comparing an instructed, desired signal wave with a carrier wave, the PWM signal serving to control the AC voltage. The PWM signal generating section includes a phase adjusting section configured to advance a phase of the signal wave by adding, to the signal wave, a phase delay component of the PWM signal with respect to the signal wave, the phase delay component being involved by digital control.

According to a second aspect of the present invention, in the PWM inverter according to the first aspect, the carrier wave is a triangular wave or a sawtooth wave that is synchronized with control cycles for generating the signal wave.

According to a third aspect of the present invention, in the PWM inverter according to the first aspect, in a case where a control frequency for generating the signal wave is equal to a carrier wave frequency multiplied by a certain number, the PWM signal generating section advances the phase of the signal wave by adding, to the signal wave, a phase corresponding to a half of a control period for generating the signal wave divided by a ratio of the control frequency with respect to the carrier wave frequency.

According to a fourth aspect of the present invention, in the PWM inverter according to the first aspect, the PWM signal generating section further includes: a carrier wave frequency configured to change section for changing a carrier wave frequency; and a carrier wave generating section configured to generate the carrier wave according to the changed carrier wave frequency. The phase adjusting section adds a phase component according to a ratio of a control period for generating the signal wave with respect to the changed carrier wave frequency, to the phase of the signal wave in synchronism with the change of the carrier wave frequency.

Advantages of the Invention

According to the first aspect of the present invention, it is possible to prevent a phase error from occurring in generating a PWM waveform, that is, it is possible to prevent phase delay of a PWM waveform from a desired signal wave.

According to the second aspect of the present invention, it is possible to prevent a phase error from occurring in generating a PWM waveform, that is, it is possible to prevent phase delay of a PWM waveform from a desired signal wave in the case where the carrier wave has a periodic waveform such as a triangular wave or a sawtooth wave.

According to the third aspect of the present invention, it is possible to prevent a phase error from occurring in generating a PWM waveform, that is, it is possible to prevent phase delay of a PWM waveform from a desired signal wave in the case where the control frequency for generating the desired signal wave is equal to the carrier wave frequency multiplied by the certain number.

According to a fourth aspect of the present invention, it is possible to prevent a phase error from occurring in generating a PWM waveform, that is, it is possible to prevent phase delay of a PWM waveform from a desired signal wave even if the carrier wave frequency is changed.

DESCRIPTION OF SYMBOLS

Figure 1:
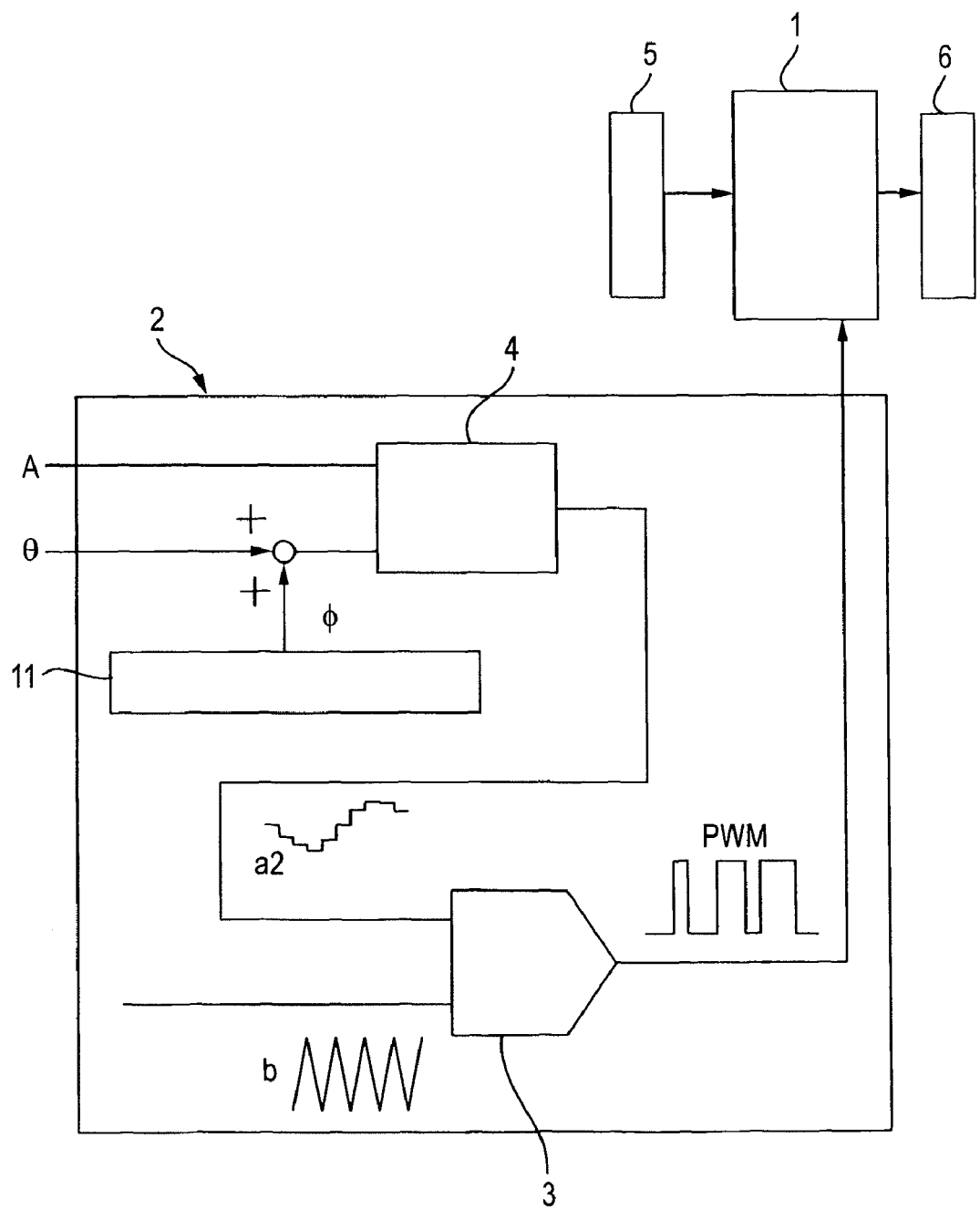
FIG. 1 shows the configuration of a PWM signal generating section of a PWM inverter according to a first embodiment of the present invention.

1: DC-to-AC converting section
2: PWM signal generating section
3: Comparator
4: Trigonometric function calculating section
5: DC input
6: AC output
11: Phase adjusting section
12: Carrier wave frequency changing section
13: Carrier wave generating section
a, a1, a2: Signal wave
a3: Desired signal wave
a4: Phase-advanced signal wave
b, b1, b2: Carrier wave
A: Amplitude
$\theta, \phi$: Phase
T, T1, T2: Period
B1, B2: Ratio of control frequency to carrier wave frequency
t: time
PWM: PWM signal

BEST MODE FOR CARRYING OUT THE INVENTION

Specific embodiments of a method of the present invention will be hereinafter described with reference to the drawings.

Embodiment 1

FIG. 1 shows the configuration of a PWM signal generating section of a PWM inverter according to a first embodiment of the present invention.

In FIG. 1, numeral 1 denotes a DC-to-AC converting section; 2, a PWM signal generating section; 3, a comparator for comparing a signal wave and a carrier wave; 4, a trigonometric function calculating section; 5, a DC input; 6, an AC output; and 11, a phase adjusting section. Symbol A denotes a desired amplitude; $\theta$, a desired phase; $\phi$, a phase by which to advance a signal wave; a2, a signal wave; b, a carrier wave; and PWM, a PWM signal.

Figure 9:
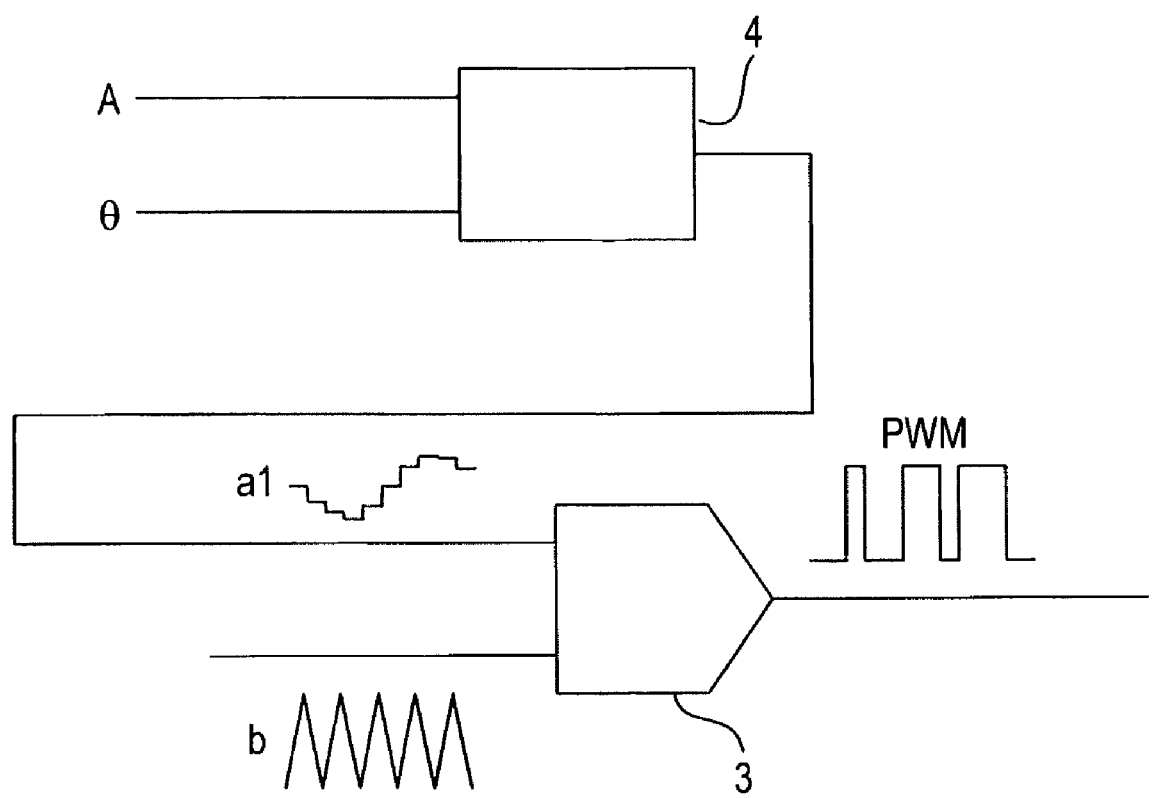
FIG. 9 shows the configuration of a PWM signal generating section of a PWM inverter in a second conventional technique.

This embodiment is different from the second conventional technique of FIG. 9 in the following point.

That is, in the PWM inverter according to the present embodiment, the PWM signal generating section 2 is equipped with the phase adjusting section 11 for advancing the phase by adding, to a signal wave, a digital-control-induced phase delay component $\phi$ of a PWM signal with respect to the signal wave.

The operation of the PWM signal generating section 2 of the PWM inverter according to the embodiment will be described below with reference to FIG. 1.

A signal a1 is generated by digital control from two data (amplitude A and phase $\theta$) by using a trigonometric function in the trigonometric function calculating section 4 with its cycles synchronized with the cycles of a carrier wave b.

Equation (3) is given by expressing the phase $\theta$ by the angular frequency $\omega$ and time t in the above-mentioned Equation (1):

$$a1 = A \sin \omega t \quad (3)$$

Figure 10:
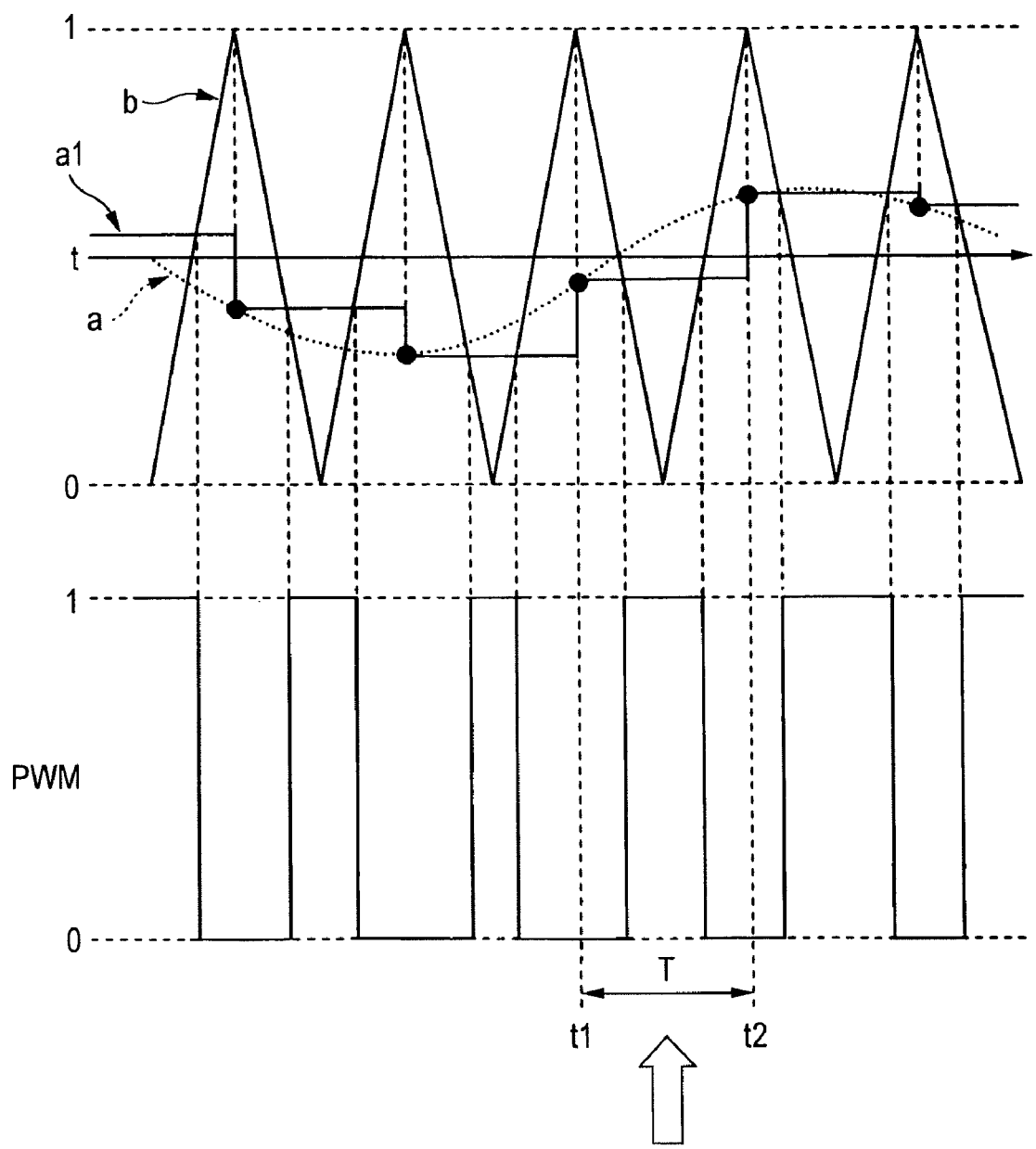
FIG. 10 shows a PWM signal waveform in the PWM signal generating section of the second conventional technique.

The PWM inverter according to the present embodiment is characterized in that the phase of a signal wave is advanced by a phase $\phi$ to prevent a phase delay of a PWM waveform with respect to a signal wave from occurring in generating the PWM waveform. In the case where the period of the digital control is equal to the carrier wave period as in the case of FIG. 10, as described above the phase error is given by Equation (2). The signal wave a1 in Equation (3) is represented as a signal wave a2 (see the following Equation (4)). That is, an appropriate procedure is such that the phase of a signal wave is advanced by adding a phase that corresponds to a half of the control period for generating the signal wave to the signal wave in the phase adjusting section 11 and a signal wave a2 is generated in the trigonometric function calculating section 4 on the basis of an amplitude A and the advanced phase.

$$a2 = A \sin(\omega t + \phi) = A \sin \omega(t + T/2) \quad (4)$$

In this case, it is necessary that the amplitude A be equal to the amplitude of a carrier wave b.

Embodiment 2

Figure 2:
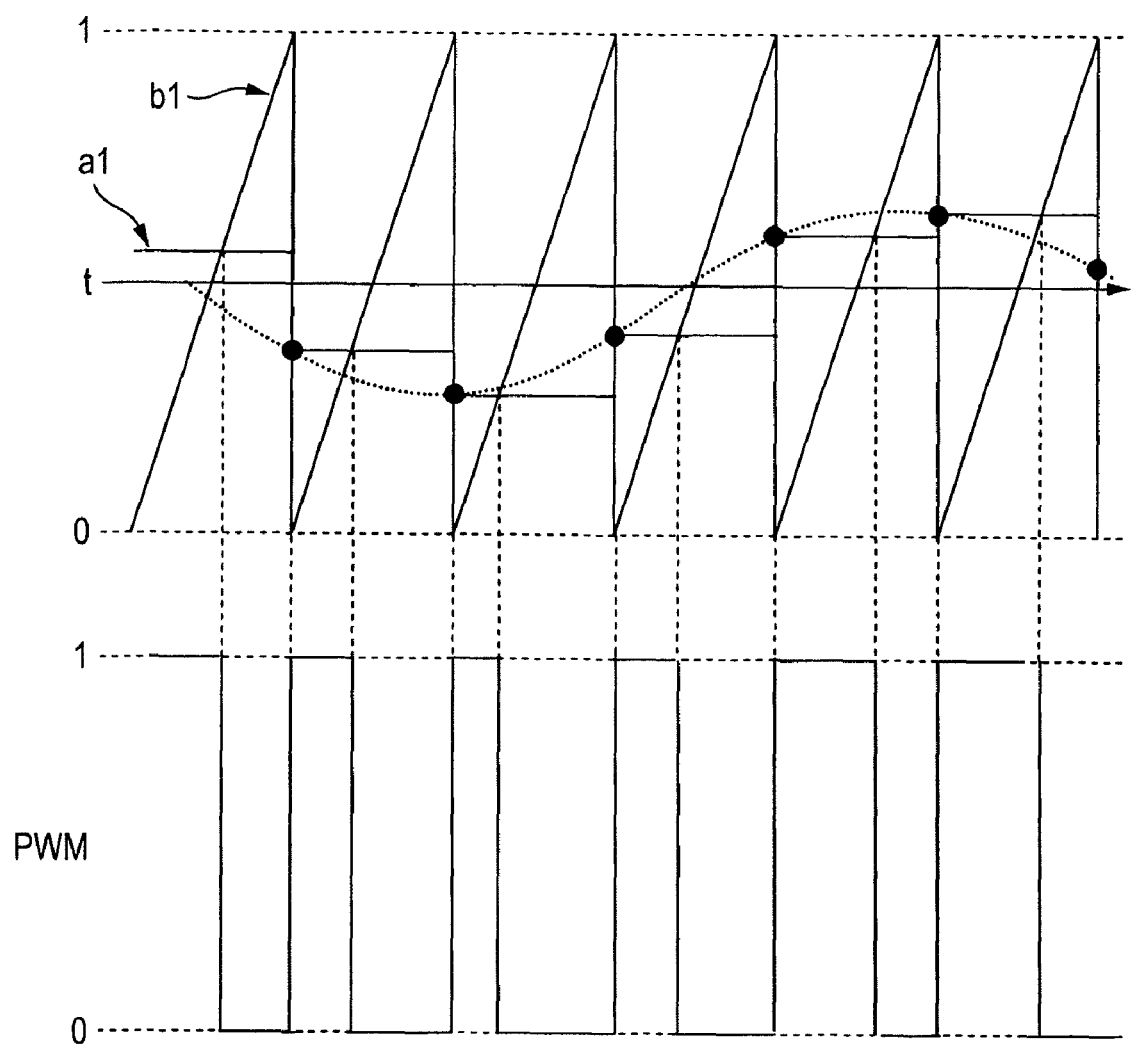
FIG. 2 illustrates a second embodiment of the present invention and shows a PWM signal waveform which is generated by using a sawtooth wave as a carrier wave in the PWM signal generating section.

FIG. 2 illustrates a second embodiment of the present invention and shows a PWM signal waveform which is generated by using a sawtooth wave as a carrier wave in the PWM signal generating section. In FIG. 2, symbol a1 denotes a signal wave; b1, a carrier wave; t, time; and PWM, a PWM signal. The configuration of this embodiment is the same as that of the first embodiment (FIG. 1) and hence its description will be omitted.

Whereas in FIG. 1 (first embodiment) the carrier wave b is a triangular wave, a similar delay occurs in the PWM waveform even in the case where the carrier wave b1 is a sawtooth wave as shown in FIG. 2 (this embodiment). Therefore, in the case where the waveform update cycles are synchronized with the carrier wave frequency as in the signal wave a1, it is possible to prevent a phase error from occurring in generating a PWM waveform by advancing the phase of the signal wave as indicated by the above-mentioned Equation (4).

Embodiment 3

Figure 3:
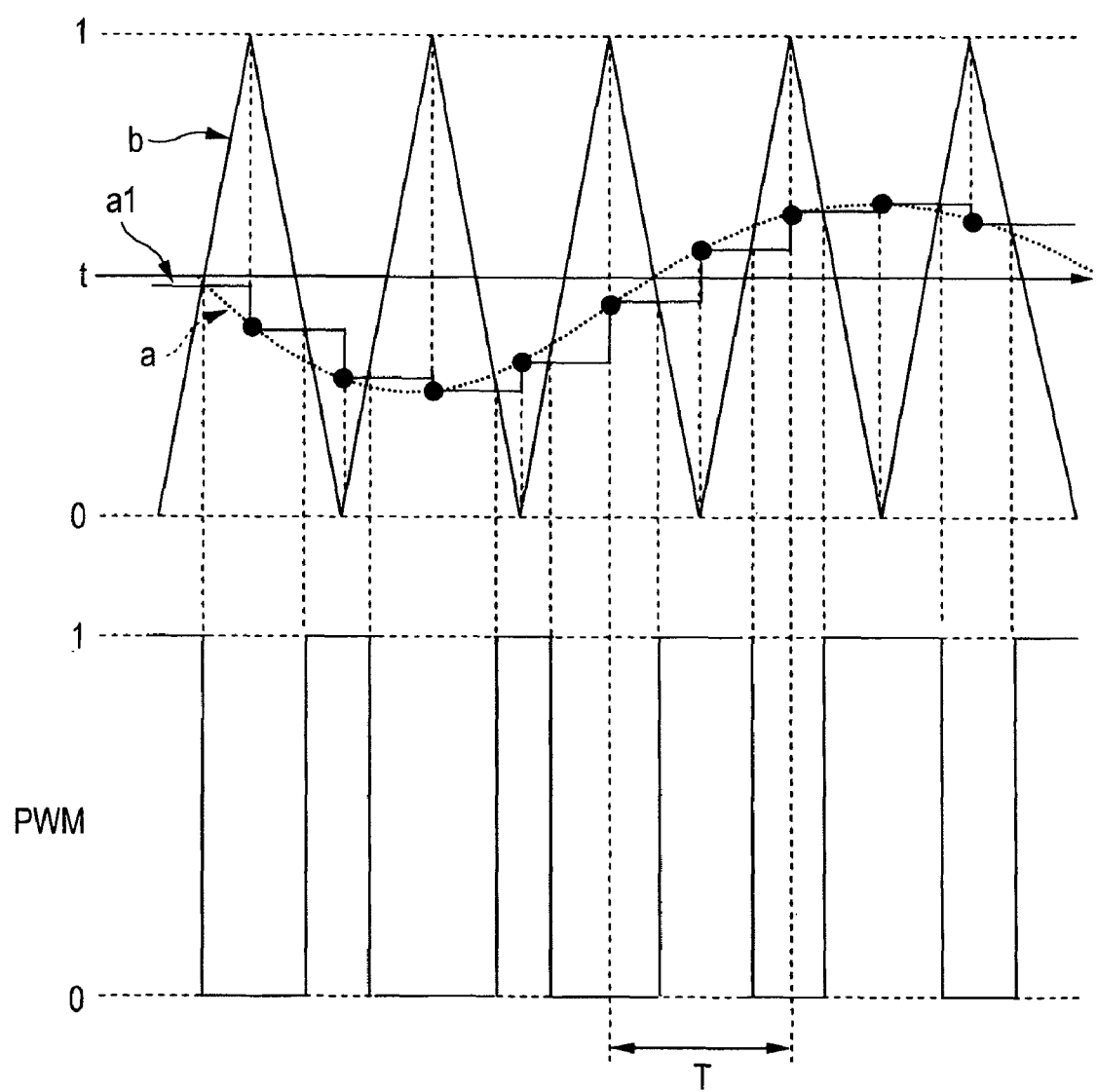
FIG. 3 illustrates a third embodiment of the present invention and shows a PWM signal waveform which is generated in such a manner that the control frequency is set at two times the carrier wave frequency in the PWM signal generating section.

FIG. 3 illustrates a third embodiment of the present invention and shows a PWM signal waveform which is generated in such a manner that the control frequency is set at two times the carrier wave frequency in the PWM signal generating section. In FIG. 3, symbols a and a1 denote signal waves; b, a carrier wave; t, time; T, the period of the carrier wave b; and PWM, a PWM signal. The configuration of this embodiment is the same as that of the first embodiment (FIG. 1) and hence its description will not be omitted.

Whereas in Equation (4) of the first embodiment the control period for generating a signal wave a1 is equal to the carrier wave frequency, a similar method can also prevent a phase error from occurring in generating a PWM wave even if the control frequency is set at integer (e.g., 2 or 3) times or ½ or ⅓ times the carrier wave frequency as shown in FIG. 3. In the case where the control frequency is set at two times the carrier wave frequency, the phase delay of the PWM waveform becomes half. When B is set to the ratio of the control frequency with respect to the carrier wave frequency, the signal wave a2 is given by Equation (5):

$$a2 = A \sin \omega(t + T/2B) \quad (5)$$

Parameter B is a natural number that is 1 or more or its reciprocal.

Embodiment 4

Figure 4:
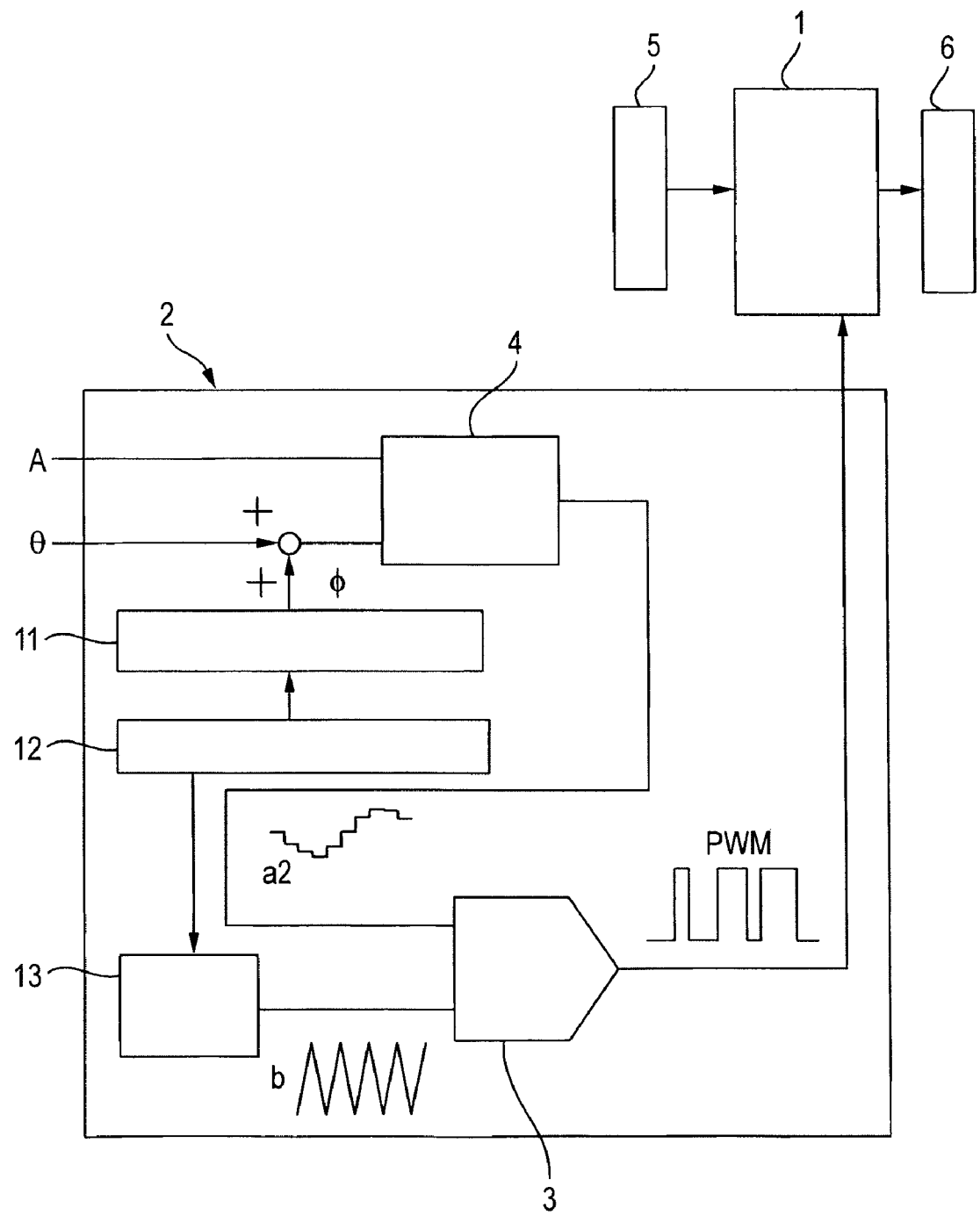
FIG. 4 shows the configuration of a PWM signal generating section of a PWM inverter according to a fourth embodiment of the present invention.

FIG. 4 shows the configuration of a PWM signal generating section of a PWM inverter according to a fourth embodiment of the present invention. In FIG. 4, numeral 12 denotes a carrier wave frequency changing section and numeral 13 denotes a carrier wave generating section. In FIG. 4, the same reference symbols as those in FIG. 1 denote the same components as those in FIG. 1 and hence their description will be omitted.

This embodiment is different from the first embodiment of FIG. 1 in the following points.

That is, in this embodiment, the carrier wave frequency changing section 12 for changing the frequency of a carrier wave and the carrier wave generating section 13 for generating a carrier wave according to a changed frequency are provided in addition to the components shown in FIG. 1. Also, the phase adjusting section 11 is configured to add, to a desired phase, a phase component according to the ratio of the control period with respect to the changed carrier wave frequency in synchronism with a change of the carrier wave frequency.

Figure 5:
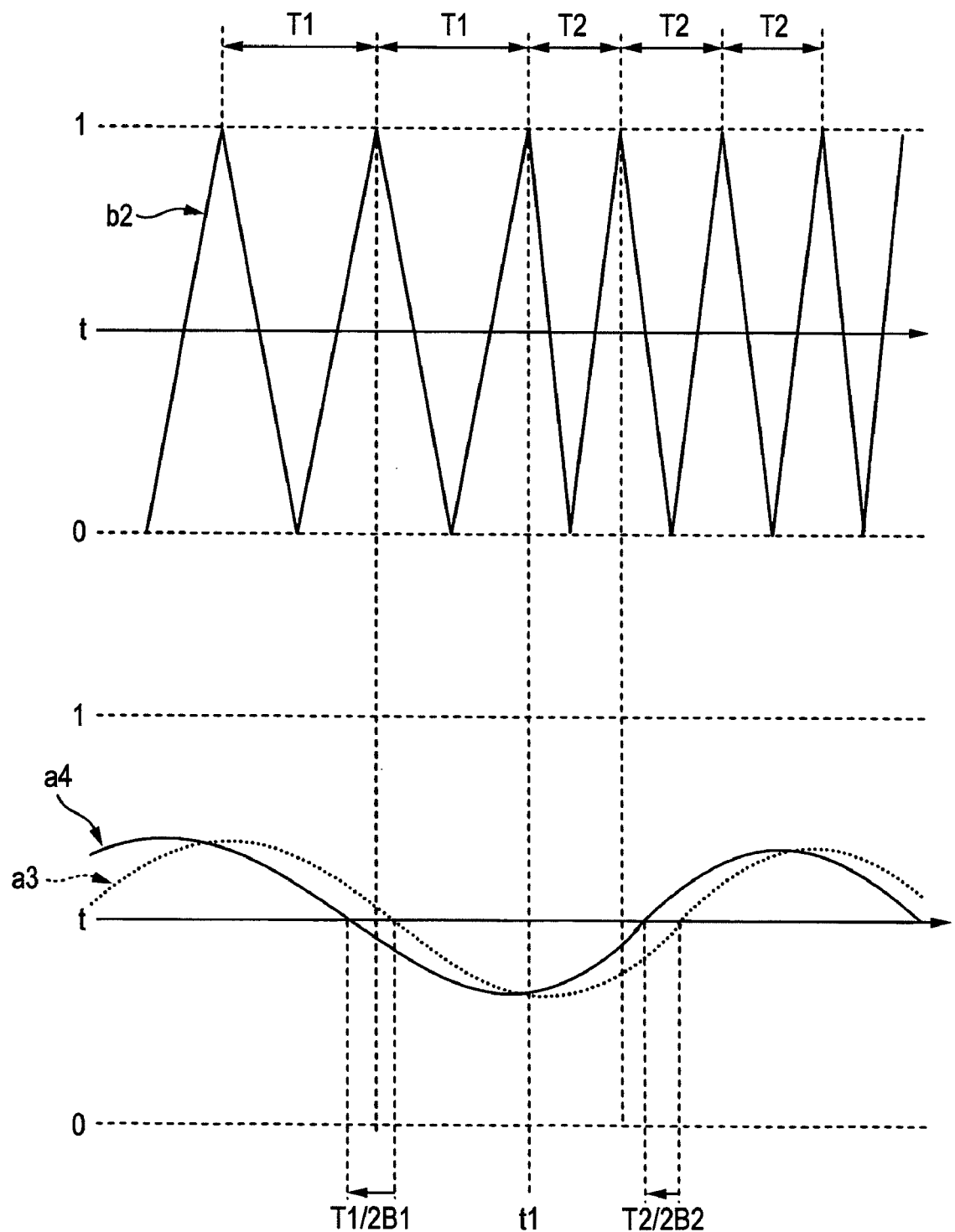
FIG. 5 illustrates a fourth embodiment of the present invention and shows a waveform of a signal wave which is generated by using a carrier wave b2 in which the carrier wave frequency is switched halfway in the PWM signal generating section of the present invention.

FIG. 5 illustrates the fourth embodiment of the present invention and shows a waveform of a signal wave which is generated by using a carrier wave b2 in which the carrier wave frequency is switched halfway in the PWM signal generating section. In FIG. 5, a3 denotes a desired signal wave; a4, a phase-advanced signal wave; b2, a carrier wave; T1, a carrier wave period before frequency switching; T2, a carrier wave period after the frequency switching; t, time; and B1, B2, ratios of the control frequency with respect to the carrier wave frequency.

As shown in FIG. 5, a signal wave a2 is generated in such a manner that the phase φ by which to advance the phase of a signal wave is changed according to the ratio of the control frequency with respect to the carrier wave frequency at time $t_1$ when the carrier wave frequency is switched. However, the carrier wave frequency should be switched with timing of coincidence of the control cycles and the carrier wave cycles, that is, at a peak or valley of the carrier wave having a triangular waveform.

Figure 6:
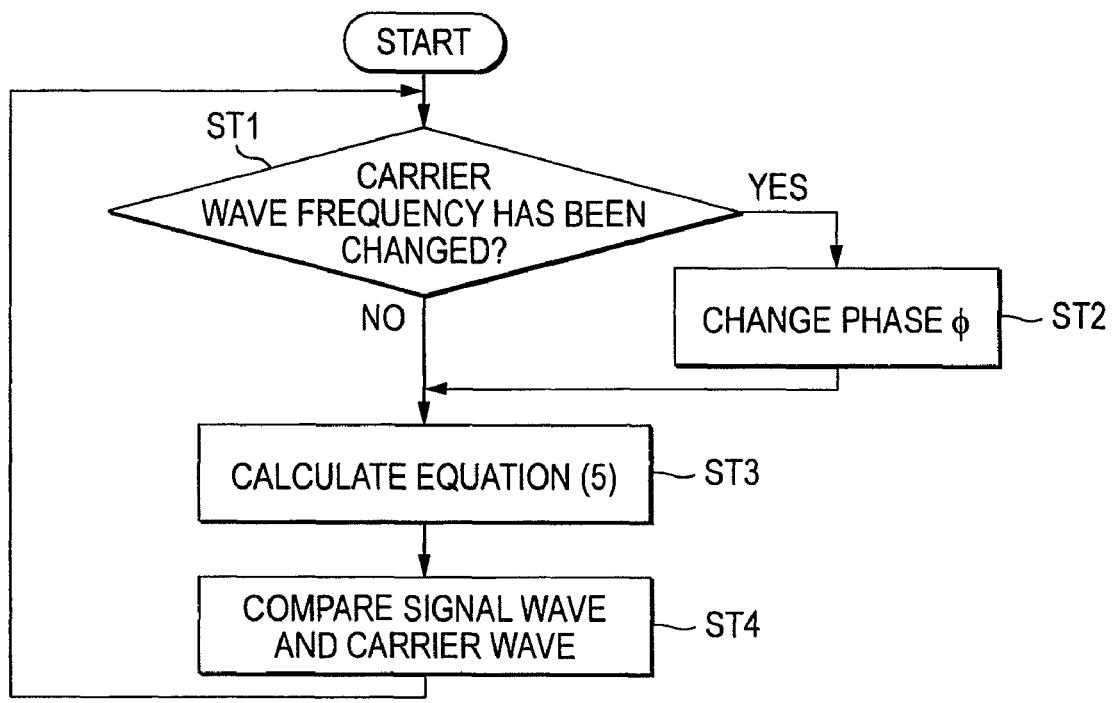
FIG. 6 is a flowchart of a processing procedure for generating a PWM signal in the PWM inverter according to the fourth embodiment of the present invention.
Figure 7:
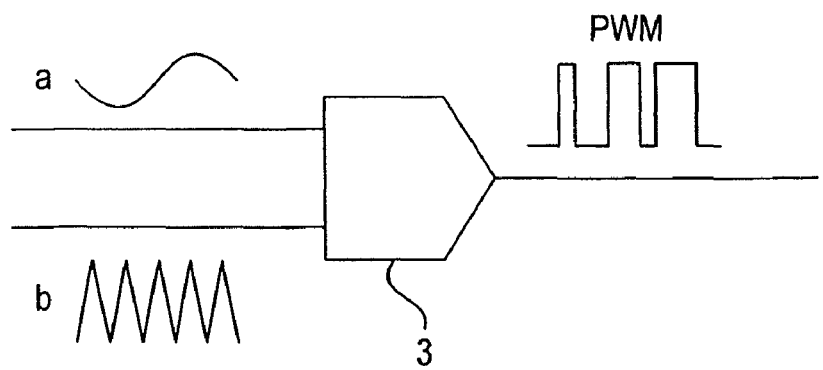
FIG. 7 shows the configuration of a PWM signal generating section of a PWM inverter in a first conventional technique.
Figure 8:
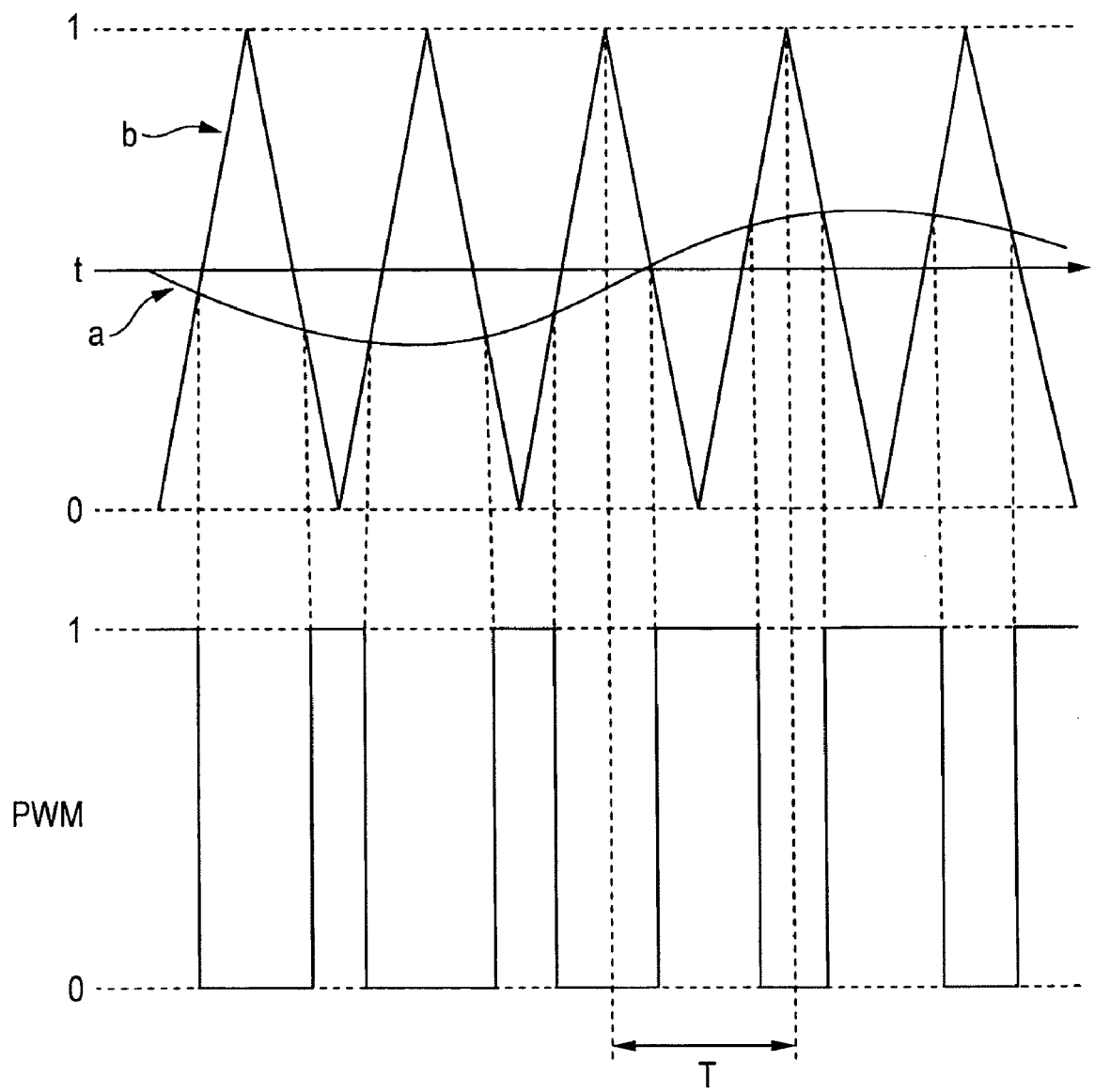
FIG. 8 shows a PWM signal waveform in the PWM signal generating section of the first conventional technique.

FIG. 6 is a flowchart of a processing procedure for generating a PWM signal in the PWM inverter according to the fourth embodiment of the present invention.

The PWM signal generating process according to the embodiment will be described in order below with reference to FIG. 6.

First, at step ST1, it is checked whether the frequency of a carrier wave b has been changed by the carrier wave frequency changing section 12. If it has been changed, at step ST2 the phase updating section 13 updates the phase φ by which to advance a desired signal wave according to the ratio of the control frequency with respect to the carrier wave frequency. At step ST3, the trigonometric function calculating section 4 calculates a signal wave a2 according to Equation (5). At step ST4, the amplitudes of the signal wave a2 and the carrier wave b are compared with each other by the comparator 3 and thus a PWM signal is generated.

As described above, in the PWM inverter according to this embodiment can cope with a change of the carrier wave frequency and prevent a phase delay from occurring in generating a PWM wave because the phase of a desired signal wave is advanced from the carrier wave frequency.

INDUSTRIAL APPLICABILITY

The present invention is applicable to various power converters using PWM.

The invention claimed is:

1. A PWM inverter for controlling an AC voltage using a PWM signal, the PWM inverter comprising:

a DC-to-AC converting section configured to convert a DC voltage into the AC voltage; and a PWM signal generating section configured to generate the PWM signal by comparing an signal wave with a carrier wave, wherein the PWM signal generating section comprises a phase adjusting section configured to compensate a phase of the signal, wave by adding, to the phase of the signal wave, a phase delay component of the PWM signal which is caused by digital control of the signal wave wherein in a case where a control frequency for generating the signal wave is equal to a carrier wave frequency multiplied by a certain number, the PWM signal generating section advances the phase of the signal wave by adding, to the phase of the signal wave, a phase corresponding to a half of a control period for generating the signal wave divided by a ratio of the control frequency with respect to the carrier wave frequency.

2. A PWM inverter for controlling an AC voltage using a PWM signal, the PWM inverter comprising:

a DC-to-AC converting section configured to convert a DC voltage into the AC voltage; and a PWM signal generating section configured to generate the PWM signal by comparing an signal wave with a carrier wave, wherein the PWM signal generating section comprises a phase adjusting section configured to compensate a phase of the signal, wave by adding, to the phase of the signal wave, a phase delay component of the PWM signal which is caused by digital control of the signal wave, wherein the PWM signal generating section further comprises:

a carrier wave frequency changing section configured to change a carrier wave frequency; and a carrier wave generating section configured to generate the carrier wave according to the changed carrier wave frequency, wherein the phase adjusting section adds a phase component according to a ratio of a control period for generating the signal wave with respect to the changed carrier wave frequency, to the phase of the signal wave in synchronism with the change of the carrier wave frequency.

3. A PWM inverter for controlling an AC voltage using a PWM signal, the PWM inverter comprising:

a DC-to-AC converting section configured to convert a DC voltage into the AC voltage; and a PWM signal generating section configured to generate the PWM signal by comparing a signal wave with a carrier wave, wherein the PWM signal generating section comprises a phase adjusting section configured to advance a phase of the signal wave by adding, to the signal wave, a phase delay component of the PWM signal with respect to the signal wave, the phase delay component being involved by digital control, wherein in a case where a control frequency for generating the signal wave is equal to a carrier wave frequency multiplied by a certain number, the PWM signal generating section advances the phase of the signal wave by adding, to the signal wave, a phase corresponding to a half of a control period for generating the signal wave divided by a ratio of the control frequency with respect to the carrier wave frequency.

4. A PWM inverter for controlling an AC voltage using a PWM signal, the PWM inverter comprising:

a DC-to-AC converting section configured to convert a DC voltage into the AC voltage; and a PWM signal generating section configured to generate the PWM signal by comparing a signal wave with a carrier wave, wherein the PWM signal generating section comprises a phase adjusting section configured to advance a phase of the signal wave by adding, to the signal wave, a phase delay component of the PWM signal with respect to the signal wave, the phase delay component being involved by digital control, wherein the PWM signal generating section further comprises:

a carrier wave frequency changing section configured to change a carrier wave frequency; and a carrier wave generating section configured to generate the carrier wave according to the changed carrier wave frequency, wherein the phase adjusting section adds a phase component according to a ratio of a control period for generating the signal wave with respect to the changed carrier wave frequency, to the phase of the signal wave in synchronism with the change of the carrier wave frequency.

* * * * *